(12) United States Patent
Czornomaz et al.

(10) Patent No.: US 9,673,104 B1
(45) Date of Patent: Jun. 6, 2017

(54) FABRICATION OF A CMOS STRUCTURE

(71) Applicant: International Business Machines Corporation, Armonk, NY (US)

(72) Inventors: Lukas Czornomaz, Rueschlikon (CH); Veeresh Vidyadhar Deshpande, Rueschlikon (CH); Vladimir Djara, Rueschlikon (CH); Jean Fompeyrine, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/040,346

(22) Filed: Feb. 10, 2016

(51) Int. Cl.
*H01L 21/82* (2006.01)
*H01L 21/8238* (2006.01)
*H01L 27/092* (2006.01)
*H01L 21/02* (2006.01)

(52) U.S. Cl.
CPC ........... *H01L 21/823807* (2013.01); *H01L 21/02068* (2013.01); *H01L 21/823814* (2013.01); *H01L 21/823864* (2013.01); *H01L 27/092* (2013.01)

(58) Field of Classification Search
CPC ........... H01L 21/823807; H01L 27/092; H01L 21/02068; H01L 21/823864; H01L 21/823814
See application file for complete search history.

(56) References Cited

U.S. PATENT DOCUMENTS

2015/0228670 A1* 8/2015 Caimi .............. H01L 21/02532
257/351

* cited by examiner

*Primary Examiner* — Roy Potter
*Assistant Examiner* — Paul Patton
(74) *Attorney, Agent, or Firm* — Harrington & Smith

(57) ABSTRACT

A first channel structure includes $Si_xGe_{1-x}$ and a second channel structure includes a group III-V compound material. First and second gate stacks are formed on the first and second channel structures. An insulating layer is formed on the gate stacks and the channel structures and is removed from the first channel structure to form a spacer on sidewalls of the first gate stack. First raised source and drain layers are formed on the first channel structure. The insulating layer is removed from the second channel structure to form a spacer on sidewalls of the second gate stack. The surfaces of the first and second channel structures and first source and drain layers are oxidized. The oxide layers are treated by a cleaning process that selectively removes the second native oxide layer only. Second raised source and drain layers are formed on the second channel structure. A CMOS structure is disclosed.

20 Claims, 6 Drawing Sheets

FABRICATION OF A CMOS STRUCTURE

BACKGROUND

The embodiments of the invention relate generally to the fabrication of semiconductor structures and more particularly to the fabrication of CMOS devices having two different semiconductor channel materials on a common semiconductor substrate with dual raised source and drains.

Leading edge Si CMOS industry is facing strong limitations with Si for 10 nm node sizes and beyond. One promising approach to achieving sub-10 nm geometry devices is co-integration of $Si_xGe_{1-x}$ (where x=0 to 1) p-FETs with group III-V compound n-FETs.

In devices with raised source and drains, the source and drain layers are formed above the channel material to achieve low series resistance.

N-FETs and p-FETs need a different selective epitaxy step to form the raised source and drain regions. These two epitaxy steps are typically done one after the other, wherein a first spacer layer is used to mask the p-regions while growing the n-regions and a second spacer layer is used to mask the n-regions while growing the p-regions. This leads to two different final spacer thicknesses for n-FETs and p-FETs.

SUMMARY

According to a first aspect, a method is disclosed for fabricating a CMOS structure. The method comprises providing a semiconductor substrate and forming a first channel structure comprising a first semiconductor material and a second channel structure comprising a second semiconductor material on the substrate. The first semiconductor material is comprised of $Si_xGe_{1-x}$ where x=0 to 1 and the second semiconductor material is comprised of a group III-V compound material. The method further comprises forming a first gate stack on the first channel structure and a second gate stack on the second channel structure. Another step comprises forming an insulating layer on the first gate stack, the first channel structure, the second gate stack and the second channel structure and selectively removing by a first lithography and etching step the insulating layer from the first channel structure to form a first insulating spacer on sidewalls of the first gate stack. The method further comprises forming a first raised source layer and a first raised drain layer on the first channel structure by selective epitaxy, selectively removing by a second lithography and etching step the insulating layer from the second channel structure to form a second insulating spacer on sidewalls of the second gate stack and oxidizing the surfaces of the first channel structure, the first source layer, the first drain layer and the second channel structure. Thereby a first native oxide layer comprising an oxide of the first semiconductor material and a second native oxide layer comprising an oxide of the second semiconductor material is grown. Further steps comprise treating the first native oxide layer and the second native oxide layer by a selective cleaning process that selectively removes the second native oxide layer only and forming a second raised source layer and a second raised drain layer on the second channel structure by selective epitaxy.

According to another aspect, a method is disclosed for fabricating a CMOS structure comprising providing a semiconductor substrate and forming a first channel structure comprising a first semiconductor material and a second channel structure comprising a second semiconductor material on the substrate. The first semiconductor material is comprised of $Si_xGe_{1-x}$ where x=0 to 1 and the second semiconductor material is comprised of a group III-V compound material. The method further comprises forming a first gate stack on the first channel structure and a second gate stack on the second channel structure and forming an insulating layer on the first gate stack, the first channel structure, the second gate stack and the second channel structure. Further steps comprise selectively removing by a first lithography and etching step the insulating layer from the first channel structure to form a first insulating spacer on sidewalls of the first gate stack, forming a first raised source layer and a first raised drain layer on the first channel structure by selective epitaxy and oxidizing the surfaces of the first channel structure, the first source layer and the first drain layer. Thereby a first native oxide layer comprising an oxide of the first semiconductor material is grown.

The method further comprises selectively removing by a second lithography and etching step the insulating layer from the second channel structure to form a second insulating spacer on sidewalls of the second gate stack and treating the first native oxide layer and a second native oxide layer by a selective cleaning process that selectively removes the second native oxide layer only. The second native oxide layer comprises an oxide of the second semiconductor material and is grown on the surface of the second channel structure after the second lithography step. Finally a second raised source layer and a second raised drain layer are formed on the second channel structure by selective epitaxy.

According to another aspect, a CMOS structure is disclosed comprising a semiconductor substrate, a first channel structure comprising a first semiconductor material and a second channel structure comprising a second semiconductor material on the substrate. The first semiconductor material is comprised of $Si_xGe_{1-x}$ where x=0 to 1 and the second semiconductor material is comprised of a group III-V compound material. The CMOS structure further comprises a first gate stack on the first channel structure and a second gate stack on the second channel structure, a first insulating spacer on sidewalls of the first gate stack, a first raised source layer and a first raised drain layer on the first channel structure. The CMOS structure further comprises a second insulating spacer on sidewalls of the second gate stack, a second raised source layer and a second raised drain layer on the second channel structure. The thickness of the first spacer is equal to the thickness of the second spacer.

Embodiments of the invention will be described in more detail below, by way of illustrative and non-limiting examples, with reference to the accompanying drawings.

BRIEF DESCRIPTION OF THE SEVERAL VIEWS OF THE DRAWINGS

FIG. 1 shows a cross sectional view of a starting structure;

FIG. 2 shows a cross-sectional view after a first lithography and etching step;

FIG. 3 shows a cross-sectional view after formation of a first raised source layer and a second raised drain layer by selective epitaxy;

FIG. 4 shows a cross-sectional view after a second lithography and etching step;

FIG. 5 shows a cross-sectional view after the formation of first and second native oxide layers by chemical oxidation;

FIG. 6 show a cross-sectional view after removal of the second native oxide layer by a selective cleaning process;

FIG. 7 show a cross-sectional view after formation of a second raised source layer and a second raised drain layer by selective epitaxy;

FIG. 8 shows a cross-sectional view of a final structure;

FIG. 9 shows a structure corresponding to the structure of FIG. 3 as starting structure to illustrate a method according to another embodiment;

FIG. 10 shows a cross-sectional view after the formation of a first native oxide layer by chemical oxidation;

FIG. 11 shows a cross-sectional view after a second lithography step; and

FIG. 12 shows a cross-sectional view after removal of a second native oxide layer by a selective cleaning process.

DETAILED DESCRIPTION

In reference to FIGS. 1-12, some general aspects and terms of embodiments are described first.

The term native oxide refers according to embodiments herein to an oxide that is grown from an underlying semiconductor material either in a controlled manner using an oxidizing agent or grown in an uncontrolled manner due to exposure to ambient.

A semiconductor substrate may be a bulk semiconductor substrate, a substrate comprising an insulating layer such as a silicon on insulator (SOI) substrate or a hybrid substrate.

A high k-dielectric layer is a layer comprising a dielectric material having a higher dielectric constant k than $SiO_2$. $SiO_2$ has a dielectric constant k of 3.9 and accordingly dielectric materials having a dielectric constant k of more than 3.9 are denoted as high-k materials.

FIGS. 1-8 show successive stages of a method for fabricating a CMOS structure according to an embodiment. FIGS. 1-8 and the other Figures subsequently described below generally show enlarged cross-sectional views of initial, intermediate and final structures formed during the stages of the method. In any or all of the figures, the dimensions may not be drawn to scale and may be shown in a simplified and schematic way to illustrate the features and principles of embodiments.

Figure 1:
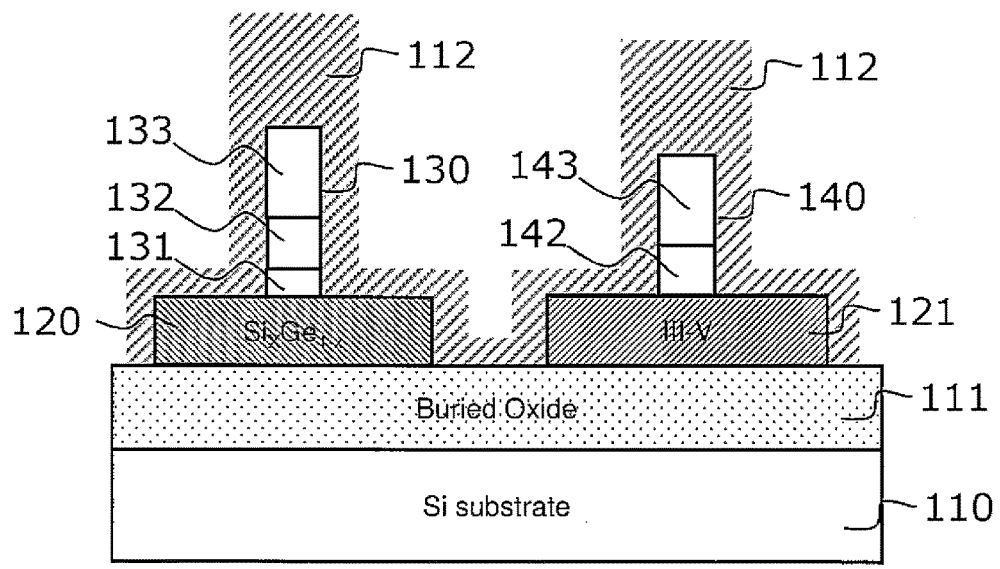
FIGS. 1-12 show cross sectional views of successive stages of a method for fabricating a CMOS structure according to embodiments.

FIG. 1 illustrates a cross-sectional view of a starting structure 100. The starting structure 100 comprises a substrate 110. The substrate 110 may be e.g. embodied as a Si substrate or a SiGe substrate. On the substrate 110 a first insulating layer 111 is provided. The insulating layer 111 may be embodied e.g. as a dielectric layer comprising $SiO_2$ and is in the following also denoted as a buried oxide (BOX) layer. The thicknesses of the Si substrate 110 and the insulating layer 111 can be any suitable thicknesses. On the first insulating layer 111 a first channel structure 120 is formed on the left side that comprises a first semiconductor material. Furthermore, on the right side a second channel structure 121 is formed on the first insulating layer 111 that comprises a second semiconductor material. The first semiconductor material may be embodied as $Si_xGe_{1-x}$, where x=0 to 1. In other words, the first semiconductor material may be embodied as Silicon (Si), Germanium (Ge) or a SiGe alloy. In the following references to SiGe shall be understood as references to $Si_xGe_{1-x}$ where x=0 to 1. The first channel structure may be formed by any suitable methods known in the art, e.g. by Ge-condensation. The second channel structure may be formed by any suitable methods known in the art, such as selective epitaxy or wafer bonding.

According to another embodiment the first and the second gate channel structure could be formed directly on a bulk Si-substrate. The substrate 110 may also be denoted as wafer 110.

The second semiconductor material may be generally embodied as a group III-V compound material. According to embodiments, the second semiconductor material may be $In_xGa_{1-x}As$ where x=0 to 1, i.e. from GaAs to InAs. According to another embodiment, the second semiconductor material may be InP or InGaSb. According to other embodiments, the second semiconductor material may be a further alloyed combination of (In, Ga) (As, Sb, P).

The first channel structure 120 and the second channel structure 121 may have a thickness of, for example, about 5 nm that corresponds to a desired channel thickness of a subsequently formed PFET and NFET respectively.

SiGe is a preferred material for the implementation of a P-Channel Field Effect Transistor (PFET) in view of its high hole mobility. Group III-V materials are preferred materials for implementing a N-Channel Field Effect Transistors (NFET) as they exhibit a high electron mobility.

On the first channel structure 120, there is formed a first gate stack 130 and on the second channel structure 121 there is formed a second gate stack 140.

The first gate stack 130 comprises an interlayer 131, a gate dielectric layer 132 and a gate metal layer 133. The interlayer 131 may be embodied as a $SiO_2$ layer. The gate dielectric layer 132 may be embodied as high-k layer of e.g. $HfO_2$. The gate metal layer 133 may be embodied e.g. as a layer of TiN, W, Al or poly-silicon. The interlayer 131 serves as an interface between the gate dielectric layer 132 and the SiGe surface of the first channel structure 120 to facilitate the high-k deposition of the gate dielectric layer 132.

The second gate stack 140 comprises a gate dielectric layer 142 and a gate metal layer 143. The gate dielectric layer 142 may be embodied as high-k layer of e.g. $HfO_2$. The gate metal layer 143 may be embodied e.g. as a layer of TiN, W, Al or poly-silicon.

Finally a second insulating layer 112 has been deposited over all exposed surfaces of the first channel structure 120, the second channel structure 121, the first gate stack 130 and the second gate stack 140. The second insulating layer may be embodied in particular as a layer of SiN and serves as a mask layer for selective epitaxy steps as will be described below in more detail.

The formation of the structure 100 including the deposition of the gate stacks may be performed by methods well known in the art including e.g. atomic layer deposition (ALD), chemical vapor deposition (CVD) methods, lithography and etching.

Figure 2:
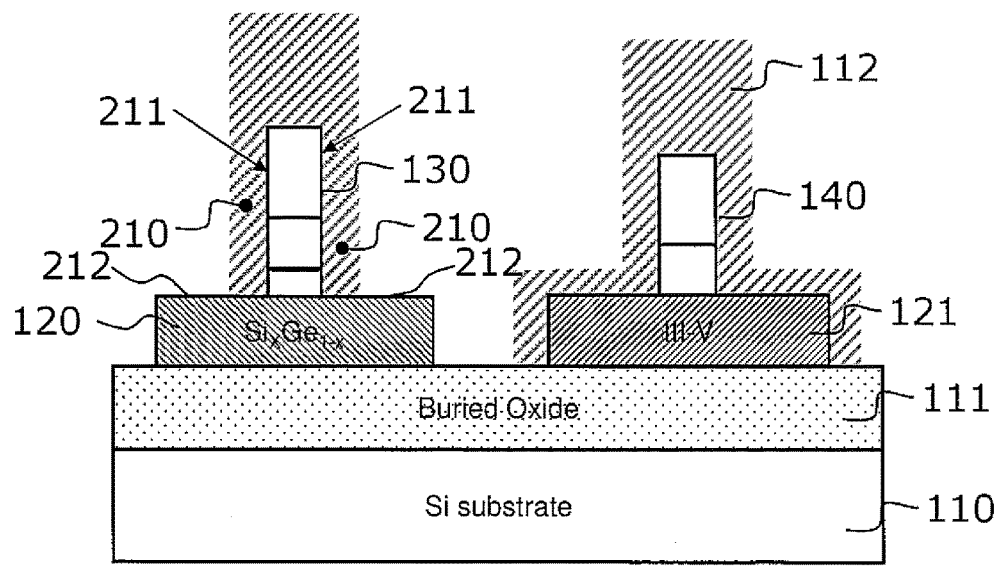

FIG. 2 shows as structure 200 a cross-sectional view of the structure of FIG. 1 after the second insulating layer 112 has been selectively removed by a first lithography and etching step from the first channel structure 120. The first lithography and etching step can be performed in a standard way e.g. by photolithography and includes application of photoresist, light exposure, developing, etching and photoresist removal. According to another embodiment, electron beam lithography or other suitable lithography methods may be used.

The first lithography step has formed first insulating spacers 210 on sidewalls 211 of the first gate stack 130. As a result of the first lithography step, surfaces 212 of the first channel structure 120 have been exposed for the subsequent growth of raised source and drain layers.

Figure 3:
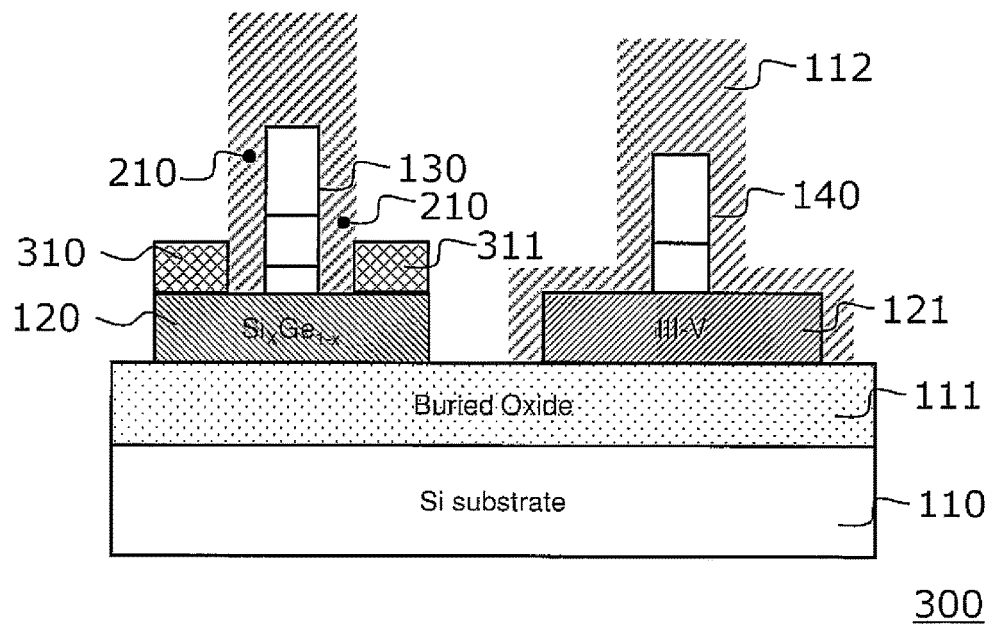

FIG. 3 shows as structure 300 a cross-sectional view of the structure of FIG. 2 after forming a first raised source layer 310 and a first raised drain layer 311 on the first channel structure 120 by selective epitaxy. The first raised source layer 310 and the first raised drain layer 311 comprises also the first semiconductor material and may hence be embodied as $Si_xGe_{1-x}$, where x=0 to 1. According to embodiments, the ratio x of Si in the SiGe alloy of the first source layer 310 and the first drain layer 311 may be different from the ratio x of Si in the SiGe alloy of the first channel structure 120. According to an embodiment, the ratio x is 0.5 in the first source layer 310 and the first drain layer 311 and 0.75 in the first channel structure 120. Such a different ratio may induce strain in the first channel structure 120, which results in a compressed channel structure 120 and an improved device performance. The first source layer 310 and the first drain layer 311 are doped with a p-type dopant, e.g. with boron (B). The doping can be performed by in-situ doping during the selective epitaxy step. Before the execution of the epitaxy step, the surface 212 may be cleaned to remove any native oxides that may have been grown on the exposed surface 212.

Figure 4:
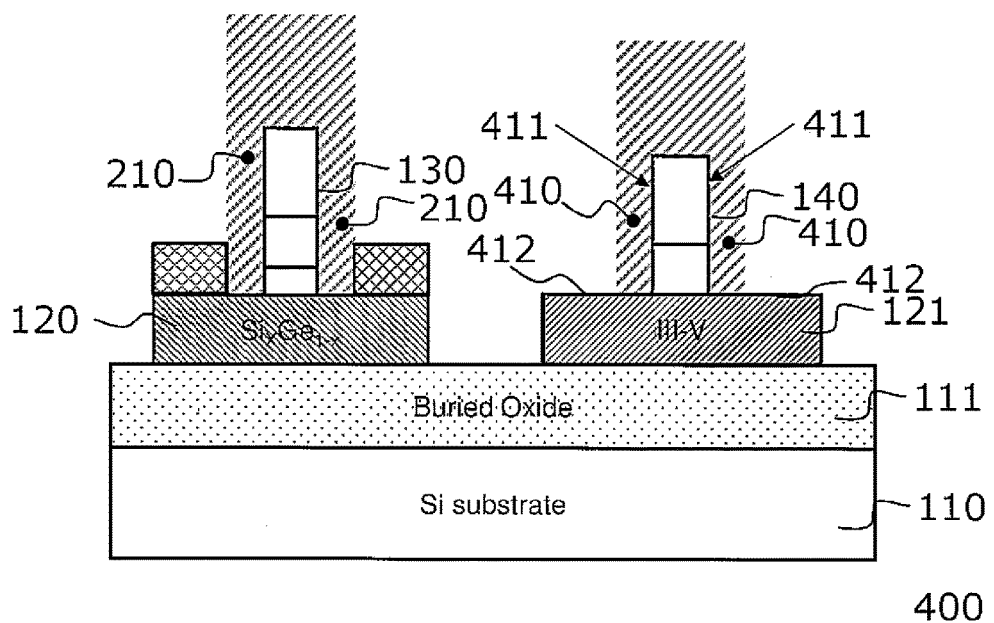

FIG. 4 shows as structure 400 a cross-sectional view of the structure of FIG. 3 after a second lithography step. By the second lithography step the second insulating layer 112 has been removed from the second channel structure 121 and a second insulating spacer 410 has been formed on sidewalls 411 of the second gate stack 140. The second lithography step can be performed in a standard way e.g. by photolithography and includes application of photoresist, light exposure, developing, etching and photoresist removal. As a result of the second photolithography step, surfaces 412 of the second channel structure 121 have been exposed for the subsequent growth of raised source and drain layers. As mentioned above, also other lithography methods such as electron beam lithography may be used.

Figure 5:
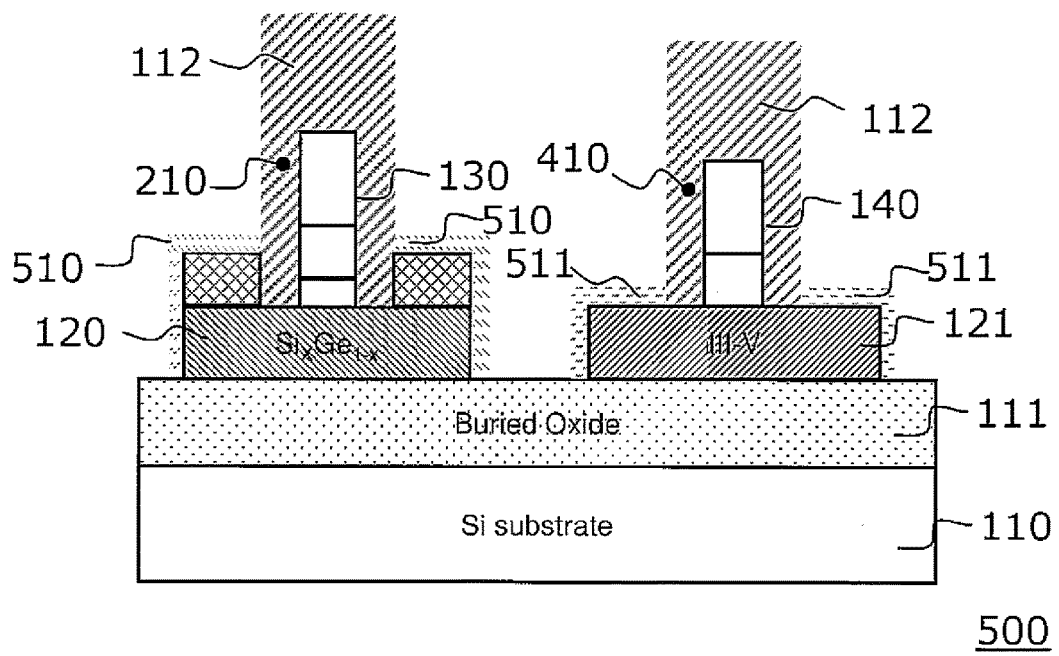

FIG. 5 shows as structure 500 a cross-sectional view of the structure of FIG. 4 after the exposed surface of the first channel structure 120, the exposed surface of the first raised source layer 310, the exposed surface of the first drain layer 311 and the exposed surface of the second channel structure 121 have been oxidized, in particular chemically oxidized. In this respect, exposed surfaces are all surfaces that are not covered by the second insulating layer 112. The chemical oxidation has grown a first native oxide layer 510 comprising an oxide of the first semiconductor material. Accordingly the first native oxide layer 510 may comprise native oxides of Si and/or Ge, namely $SiO_2$ and/or $GeO_2$. In parallel and simultaneously the chemical oxidation has grown a second native oxide layer 511 comprising an oxide of the second semiconductor material. Accordingly the second native oxide layer 511 may comprise native oxides of III-V materials, e.g. $In_2O_3$, $Ga_2O_3$ and/or $As_2O_3$.

According to embodiments, the first native oxide layer 510 and the second native oxide layer 511 are formed by a controlled self-limiting oxidation. Such a controlled self-limiting oxidation limits the thickness of the native oxide layer. A controlled self-limiting oxidation may form thin native oxide layers which are sufficient to mask the surfaces during a subsequent epitaxy step. According to further embodiments, the first native oxide layer 511 has a thickness of less than 10 nm, and preferably of less than 5 nm and most preferably of less than 2 nm.

The chemical oxidation of the exposed surfaces of the first channel structure 120, the first raised source layer 310, the first drain layer 311 and the second channel structure 121 may be performed according to some embodiments by treatment of the surfaces with liquid solutions, e.g. with hydrogen peroxide ($H_2O_2$) or ozonated deionized water ($DIO_3$). According to such embodiments, a wafer comprising the structure of FIG. 4 may just be dipped into the liquid solution. According to another embodiment, the surfaces may be treated with $O_2$ plasma. According to yet another embodiment, the surfaces may be treated with ozone. According to yet another embodiment, the first and the second native oxide layer may be formed by a thermal oxidation with a temperature below 500° C. The maximum temperature range is determined by the III-V materials that may not be exposed to more than 500° C. to avoid degradation of the III-V materials.

According to yet another embodiment, high pressure oxidation may be used.

The first native oxide layer 510 has the function of shielding the surfaces of the first channel structure 120, the first raised source layer 310 and the first raised drain layer 311 during a subsequent epitaxy step for growing second raised source and drain layers on the second channel structure 121. However, the second native oxide layer 511 is undesired for the growth of the second source and drain layers. More particularly, the second native oxide layer would block the growth of the second raised source and drain layers.

Figure 6:
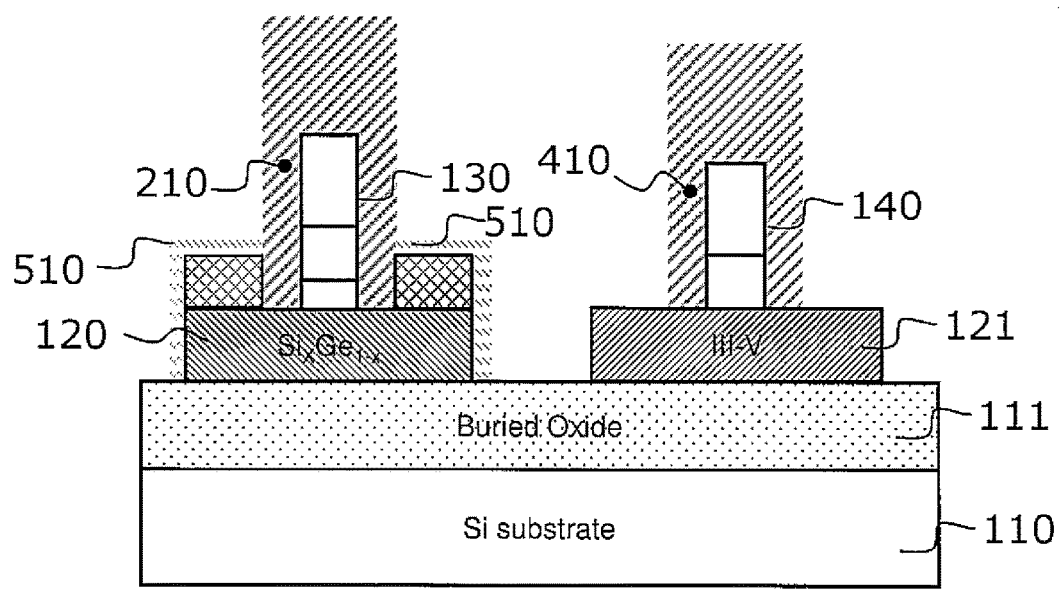

FIG. 6 show as structure 600 a cross-sectional view of the structure of FIG. 5 after the surfaces of the first native oxide layer 510 and the second native oxide layer 511 have been treated with a selective cleaning process. The selective cleaning process has selectively removed the second native oxide layer 511 only, while the first native oxide layer 510 has not been affected by the selective cleaning process and has remained unchanged or substantially unchanged. According to embodiments, the selective cleaning process takes advantage of the different chemical behavior of the oxidized SiGe materials and the oxidized III-V materials. This allows selectively removing the second native oxide layer 511 only.

According to one embodiment, the selective cleaning process may be performed by wet cleaning. Suitable materials for such a selective wet cleaning are HCl, $H_3PO_4$ or $H_2SO_4$. Such a selective wet cleaning process is very cost efficient and easy to perform. As an example, the whole wafer could be just dipped into a liquid solution comprising e.g. HCl, $H_3PO_4$ or $H_2SO_4$. Due to the different chemical behavior of the native SiGe oxides and the native III-V oxides, only the III-V oxides will be affected by the selective cleaning while the SiGe oxides remain unaffected. Accordingly, only the second native oxide layer 511 comprising the III-V oxides will be removed from the surface of the second channel structure 121 during the selective cleaning process, while the first native oxide layer 510 will remain on the surfaces of the first channel structure 120, the first raised source layer 310 and the first raised drain layer 311.

According to another embodiment, the selective cleaning process may be performed by dry cleaning. According to such an embodiment, the first and the second native oxide layer may be treated e.g. by $H_2$ plasma, by $NH_3$ plasma or by gas annealing with $NH_3$. A preferred temperature range for this dry cleaning processes is 20° C. to 450° C. and most preferably 300° C. to 400° C.

Figure 7:
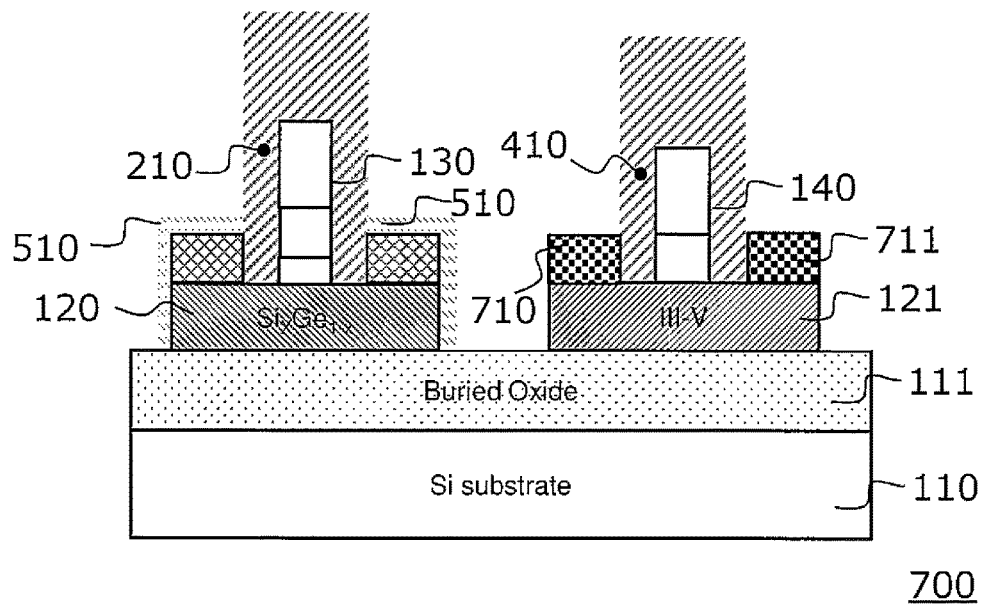

FIG. 7 shows as structure 700 a cross-sectional view of the structure of FIG. 6 after forming a second raised source layer 710 and a second raised drain layer 711 on the second channel structure 121 by selective epitaxy. During the selective epitaxy, the first native oxide layer 510 shields the surfaces of the first channel structure 120, the first raised source layer 310 and the first raised drain layer 311 such that the second semiconductor material grows only on the second channel structure 121.

The second raised source layer 710 and the second raised drain layer 711 comprise the second semiconductor material and may hence be generally embodied by a group III-V compound material. According to embodiments, the second raised source layer 710 and the second raised drain layer 711 may be layers comprising $In_xGa_{1-x}As$ where x=0 to 1 or layers comprising InP or layers comprising InGaSb. In case of layers comprising $In_xGa_{1-x}As$, the ratio x of In in the second source layer 710 and the second drain layer 711 may be different from the ratio x of In in the $In_xGa_{1-x}As$ composition of the second channel structure 121. According to an embodiment, the ratio x is 0.7 in the second raised source layer 710 and the second raised drain layer 711 and 0.53 in the second channel structure 121. Such a different ratio may induce strain in the second channel structure 121, which results in a compressed channel structure 121 and an improved device performance. The second raised source layer 710 and the second raised drain layer 711 are doped with an n-type dopant, e.g. with Si, Sn, Se, Te or Ge. The doping can be performed by in-situ doping during the selective epitaxy step.

The steps of forming the first native oxide layer 510 and the second native oxide layer 511 and the subsequent selective removal of the second native oxide layer 511 by selective cleaning provide an efficient and simple alternative to known approaches that deposit another insulating layer of e.g. SiN after the growth of the first raised source and drain layers.

Figure 8:
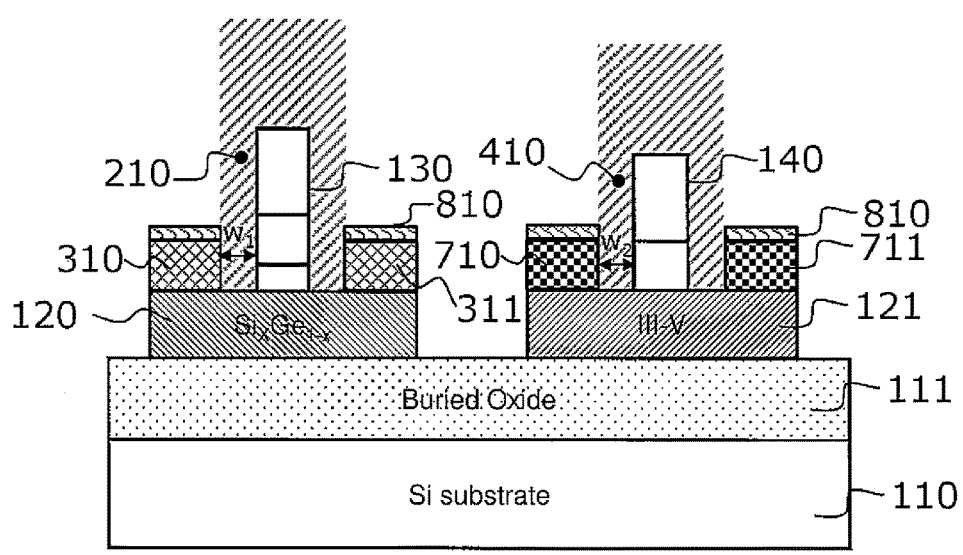

FIG. 8 shows as structure 800 a cross-sectional view of a final structure. The first native oxide layer 510 has been removed. This can be done e.g. by wet cleaning. Furthermore, contacts 810 have been formed on the first raised source layer 310, the first raised drain layer 311, the second raised source layer 710 and the second raised drain layer 711. The contacts 810 may be formed e.g. by silicide.

The whole method for fabricating a semiconductor structure according to embodiments can be performed in a temperature range below 500° C. This allows the simultaneous dual fabrication of SiGe transistors and III-V-transistors on one wafer. III-V materials and in particular InGaAs are more temperature sensitive than SiGe materials and should preferably not be processed at temperatures of more than 500° C. to avoid material degradation of the III-V materials.

As can be seen in the final structure of FIG. 8, the first insulating spacer 210 and the second insulating spacer 410 have the same lateral spacer thickness. The spacer thickness $w_1$ of the first insulating spacer 210 is the thickness between the first gate stack 130 and the first raised source layer 310 and the first raised drain layer 311 respectively. The spacer thickness $w_2$ of the second insulating spacer 410 is the thickness between the second gate stack 140 and the second raised source layer 710 and the second raised drain layer 711 respectively. The spacer thicknesses $w_1$ and $w_2$ may also be denoted as spacer width. As the spacer thickness $w_1$ of the first insulating spacer 210 is equal to the spacer thickness $w_2$ of the second insulating spacer 410, the corresponding series resistances between the first gate stack 130 and the first raised source layer 310 and the first raised drain layer 311 on the one hand and between the second insulating spacer 410 and the second raised source layer 710 and the second raised drain layer 711 on the other hand are also identical. Furthermore, the series resistances can be made smaller in comparison to prior art solutions that use two subsequently formed insulating spacer layers to form the first and the second insulating spacers.

Hence embodiments allow replacing a second spacer layer by a chemically grown Si/SiGe oxide.

FIGS. 9-12 show successive stages of a method for fabricating a CMOS structure according to another embodiment.

Figure 9:
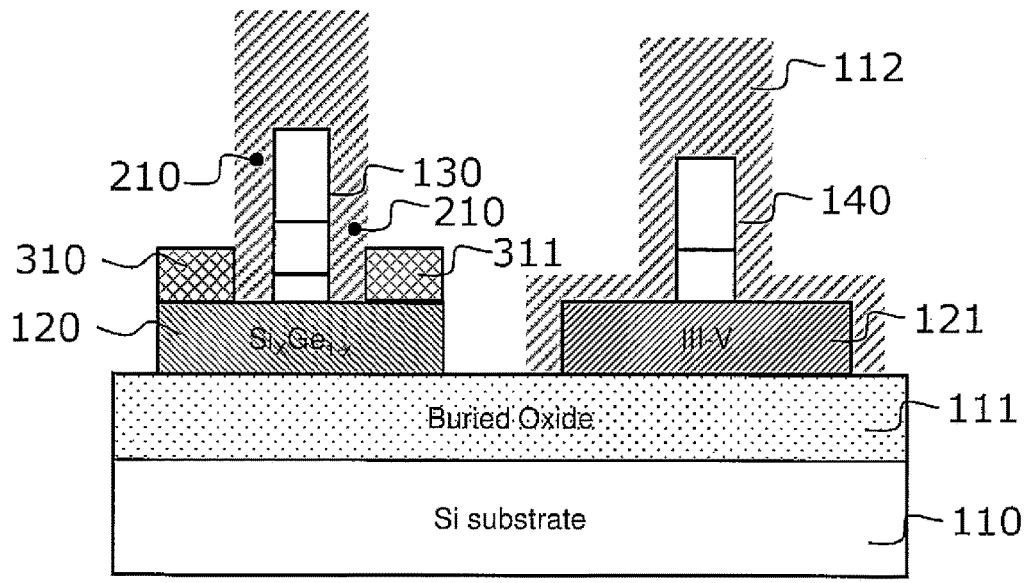

FIG. 9 shows a structure 900 that corresponds to the structure 300 of FIG. 3 and will be used as initial structure to illustrate this other embodiment.

Figure 10:
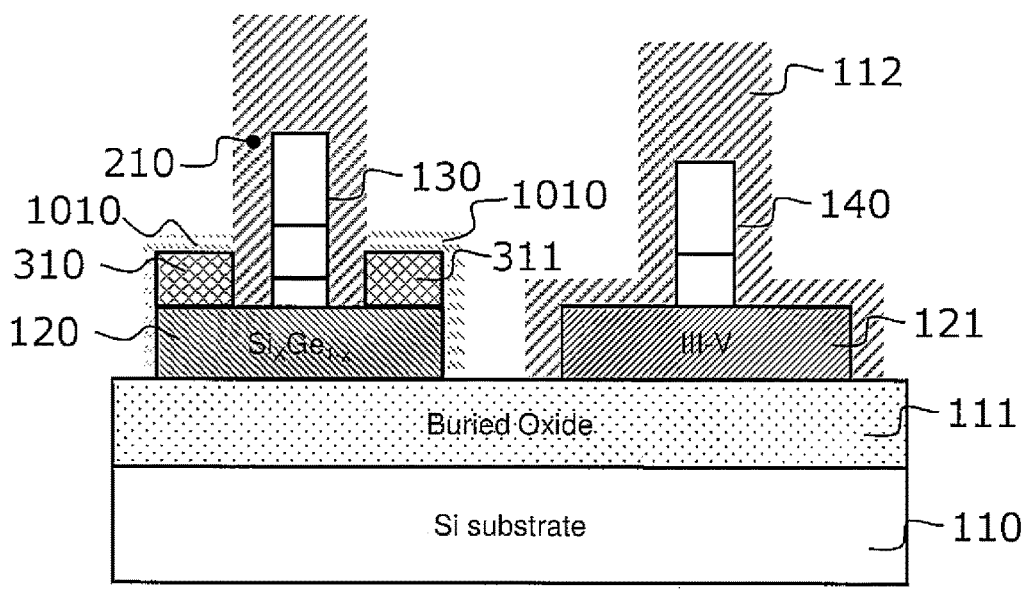

FIG. 10 shows as structure 1000 a cross-sectional view of the structure of FIG. 9 after the exposed surface of the first channel structure 120, the exposed surface of the first raised source layer 310 and the exposed surface of the first drain layer 311 have been oxidized, in particular chemically oxidized. According to this embodiment the surface of the second channel structure 121 is not exposed as it is still covered by the second insulating layer 112. The chemical oxidation has formed a first native oxide layer 1010 comprising an oxide of the first semiconductor material. Accordingly, the first native oxide layer 1010 may comprise native oxides of Si and/or Ge, namely $SiO_2$ and/or $GeO_2$.

The chemical oxidation of the exposed surfaces of the first channel structure 120, the first raised source layer 310 and the first drain layer 311 may be performed by the same treatments/methods as described above with reference to FIG. 5.

The first native oxide layer 1010 has again the function of shielding the surfaces of the first channel structure 120, the first raised source layer 310 and the first raised drain layer 311 during a subsequent epitaxy step. According to embodiments, the first native oxide layer 1010 has a thickness of less than 10 nm, and preferably of less than 5 nm and most preferably of less than 2 nm.

Figure 11:
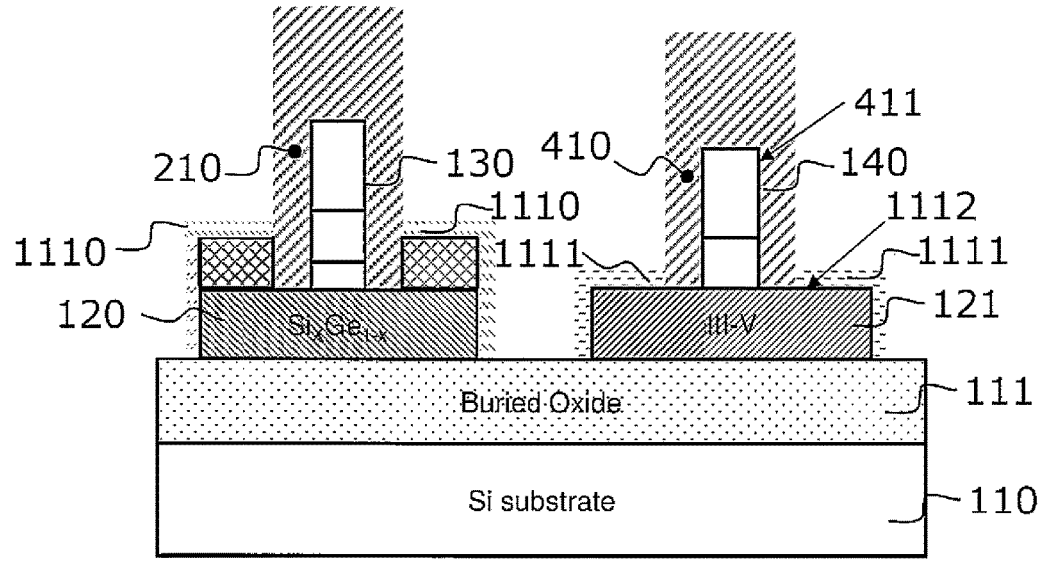

FIG. 11 shows as structure 1100 a cross-sectional view of the structure of FIG. 10 after a second lithography and etching step. By the second lithography and etching step, the second insulating layer 112 has been removed from the second channel structure 121 and a second insulating spacer 410 has been formed on sidewalls 411 of the second gate stack 140. The second lithography step can be performed in a standard way e.g. by photolithography and may include application of the photoresist, light exposure, developing, etching and photoresist removal. As a result of the second photolithography step, surfaces 1112 of the second channel structure 121 have been exposed for the subsequent growth of raised source and drain layers. However, as the surfaces 1112 will be exposed to air and therewith oxygen after the second lithography step, a second native oxide layer 1111 is naturally grown on the exposed surfaces 1112 of the second channel structure 121. Such a naturally grown oxidation may be embodied again as a controlled self-limiting oxidation. In other words, the second native oxide layer 1111 is grown during the fabrication process, but not intentional. This is in contrast to the embodiment as described with reference to FIGS. 1-8 where the second native oxide layer 511 is grown intentionally while oxidizing the surfaces of the first gate channel structure, the first source layer and the first drain layer.

According to another embodiment another step of chemical oxidation may be performed after the second lithography step. Such a second step of chemical oxidation includes chemically oxidizing the surfaces of the first native oxide layer 1110 and the exposed surfaces 1112 of the second channel structure 121 after the second lithography step. This forms in parallel a regrown or refreshed first native oxide layer 1110 and a chemically oxidized second native oxide layer 1111. With such an embodiment potential degradations of the quality of the first native oxide layer 1110 during the second lithography step can be fixed.

The chemical oxidation of the exposed surfaces of the first native oxide layer 1110 and the surfaces 1112 of the second channel structure 121 may be performed according to embodiments by the same treatments/methods as described above with reference to FIG. 5.

Figure 12:
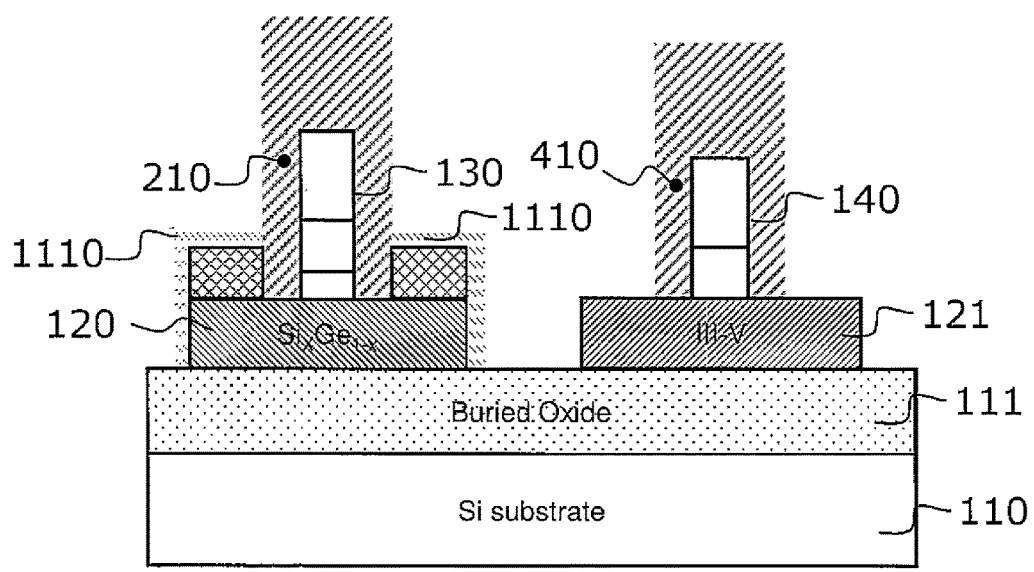

FIG. 12 shows as structure 1200 a cross-sectional view of the structure of FIG. 11 after the surfaces of the first native oxide layer 1110 and the second native oxide layer 1111 have been treated with a selective cleaning process. The selective cleaning process has selectively removed the second native oxide layer 1111, while the first native oxide layer 1110 has not been affected by the selective cleaning process and has remained unchanged or substantially unchanged.

For the selective cleaning process the same methods may be used as described with reference to FIG. 6.

In further steps corresponding to the steps as described with reference to FIGS. 7 and 8 corresponding structures as shown in FIG. 7 and FIG. 8 may be derived.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a CMOS structure, the method comprising:
    providing a semiconductor substrate;
    forming a first channel structure comprising a first semiconductor material and a second channel structure comprising a second semiconductor material on the substrate, wherein the first semiconductor material is comprised of $Si_xGe_{1-x}$ where x=0 to 1 and wherein the second semiconductor material is comprised of a group III-V compound material;
    forming a first gate stack on the first channel structure and a second gate stack on the second channel structure;
    forming an insulating layer on the first gate stack, the first channel structure, the second gate stack and the second channel structure;
    selectively removing by a first lithography and etching step the insulating layer from the first channel structure to form a first insulating spacer on sidewalls of the first gate stack;
    forming a first raised source layer and a first raised drain layer on the first channel structure by selective epitaxy;
    selectively removing by a second lithography and etching step the insulating layer from the second channel structure to form a second insulating spacer on sidewalls of the second gate stack;
    oxidizing the surfaces of the first channel structure, the first source layer, the first drain layer and the second channel structure, thereby growing a first native oxide layer comprising an oxide of the first semiconductor material and a second native oxide layer comprising an oxide of the second semiconductor material;
    treating the first native oxide layer and the second native oxide layer by a selective cleaning process that selectively removes the second native oxide layer only;
    forming a second raised source layer and a second raised drain layer on the second channel structure by selective epitaxy.

2. A method as claimed in claim 1, wherein the first and the second native oxide layer are formed by a controlled oxidation.

3. A method as claimed in claim 1, wherein the first native oxide layer has a thickness of less than 10 nm.

4. A method as claimed in claim 1, wherein the second semiconductor material is comprised of one of: $In_xGa_{1-x}As$ where x=0 to 1; InP; InGaSb and further alloyed combinations of (In, Ga) (As, Sb, P).

5. A method as claimed in claim 1, wherein oxidizing the surfaces of the first channel structure, the first source layer, the first drain layer and the second channel structure comprises one of:
    treatment of the surfaces with hydrogen peroxide ($H_2O_2$);
    treatment of the surfaces with ozonated deionized water ($DIO_3$);
    treatment of the surfaces with $O_2$ plasma;
    treatment of the surfaces with ozone;
    thermal oxidation with a temperature below 500° C.; and
    high pressure oxidation.

6. A method as claimed in claim 1, wherein the selective cleaning process comprises wet cleaning with one of: HCl; $H_3PO_4$ and $H_2SO_4$.

7. A method as claimed in claim 1, wherein the selective cleaning process comprises dry cleaning by treatment of the first and the second native oxide layer by one of:
    $H_2$ plasma;
    $NH_3$ plasma; and
    $NH_3$ gas annealing.

8. A method as claimed in claim 1, wherein the insulating layer comprises SiN or derivatives thereof.

9. A method as claimed in claim 1, wherein forming the first raised source layer and the first raised drain layer comprises in situ doping with a p-type dopant and forming the second raised source layer and the second raised drain layer comprises in situ doping with a n-type dopant.

10. A method for fabricating a CMOS structure, the method comprising:
    providing a semiconductor substrate;
    forming a first channel structure comprising a first semiconductor material and a second channel structure comprising a second semiconductor material on the substrate, wherein the first semiconductor material is comprised of $Si_xGe_{1-x}$ where
    x=0 to 1 and wherein the second semiconductor material is comprised of a group III-V compound material;
    forming a first gate stack on the first channel structure and a second gate stack on the second channel structure;
    forming an insulating layer on the first gate stack, the first channel structure, the second gate stack and the second channel structure;
    selectively removing by a first lithography and etching step the insulating layer from the first channel structure to form a first insulating spacer on sidewalls of the first gate stack;
    forming a first raised source layer and a first raised drain layer on the first channel structure by selective epitaxy;
    oxidizing the surfaces of the first channel structure, the first source layer and the first drain layer, thereby growing a first native oxide layer comprising an oxide of the first semiconductor material;

selectively removing by a second lithography and etching step the insulating layer from the second channel structure to form a second insulating spacer on sidewalls of the second gate stack;

treating the first native oxide layer and a second native oxide layer by a selective cleaning process that selectively removes the second native oxide layer only, wherein the second native oxide layer comprises an oxide of the second semiconductor material and is grown on the surface of the second channel structure after the second lithography step;

forming a second raised source layer and a second raised drain layer on the second channel structure by selective epitaxy.

11. A method as claimed in claim 10, wherein the first native oxide layer is formed by a controlled oxidation and the second native oxide layer is naturally grown by exposition of the second channel structure to oxygen during fabrication.

12. A method as claimed in claim 10, further comprising:
oxidizing the surfaces of the first native oxide layer and the second channel structure after the second lithography step, thereby forming a regrown first native oxide layer and the second native oxide layer.

13. A method as claimed in claim 10, wherein the first native oxide layer has a thickness of less than 10 nm.

14. A method as claimed in claim 10, wherein the second semiconductor material is comprised of one of: $In_xGa_{1-x}As$ where x=0 to 1; InP; InGaSb and further alloyed combinations of (In, Ga) (As, Sb, P).

15. A method as claimed in claim 10, wherein oxidizing the surfaces of the first channel structure, the first source layer and the first drain layer comprises one of:
treatment of the surfaces with hydrogen peroxide ($H_2O_2$);
treatment of the surfaces with ozonated deionized water ($DIO_3$);
treatment of the surfaces with $O_2$ plasma;
treatment of the surfaces with ozone;
thermal oxidation with a temperature below 500° C.; and
high pressure oxidation.

16. A method as claimed in claim 10, wherein the selective cleaning process comprises wet cleaning with one of: HCl; $H_3PO_4$ and $H_2SO_4$.

17. A method as claimed in claim 10, wherein the selective cleaning process comprises dry cleaning by treatment of the first and the second native oxide layer by one of:
$H_2$ plasma;
$NH_3$ plasma; and
$NH_3$ gas annealing.

18. A method as claimed in claim 10, wherein the insulating layer comprises SiN or derivatives thereof.

19. A method as claimed in claim 10, wherein forming the first raised source layer and the first raised drain layer comprises in situ doping with a p-type dopant and forming the second raised source layer and the second raised drain layer comprises in situ doping with a n-type dopant.

20. A CMOS structure comprising:
a semiconductor substrate;
a first channel structure comprising a first semiconductor material and a second channel structure comprising a second semiconductor material on the substrate, wherein the first semiconductor material is comprised of $Si_xGe_{1-x}$ where x=0 to 1 and the second semiconductor material is comprised of a group III-V compound material;
a first gate stack on the first channel structure and a second gate stack on the second channel structure;
a first insulating spacer on sidewalls of the first gate stack;
a first raised source layer and a first raised drain layer on the first channel structure;
a native oxide layer comprising an oxide of the first semiconductor material on the first raised source layer and on the first raised drain layer;
a second insulating spacer on sidewalls of the second gate stack; and
a second raised source layer and a second raised drain layer on the second channel structure;
wherein the thickness of the first insulating spacer is equal to the thickness of the second insulating spacer.

* * * * *